(12) United States Patent
Oguma et al.

(10) Patent No.: US 8,497,623 B2
(45) Date of Patent: Jul. 30, 2013

(54) PHOSPHOR-CONTAINING RESIN COMPOSITION AND SHEET, AND LIGHT EMITTING DEVICES EMPLOYING THEM

(75) Inventors: Takemi Oguma, Machida (JP); Masahiro Ibukiyama, Machida (JP); Tsuguo Hasegawa, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 443 days.

(21) Appl. No.: 11/917,513

(22) PCT Filed: Jun. 14, 2006

(86) PCT No.: PCT/JP2006/311955
§ 371 (c)(1),
(2), (4) Date: Dec. 14, 2007

(87) PCT Pub. No.: WO2006/134982
PCT Pub. Date: Dec. 21, 2006

(65) Prior Publication Data
US 2009/0085464 A1 Apr. 2, 2009

(30) Foreign Application Priority Data

Jun. 14, 2005 (JP) ................... 2005-173186
Sep. 27, 2005 (JP) ................... 2005-279855

(51) Int. Cl.
C09K 11/02 (2006.01)
H01L 33/00 (2010.01)

(52) U.S. Cl.
USPC ..... 313/503; 313/498; 313/512; 252/301.4 R; 257/98; 257/100

(58) Field of Classification Search
USPC .......................... 313/512, 502, 503
See application file for complete search history.

(56) References Cited

U.S. PATENT DOCUMENTS

| 3,253,060 | A | * | 5/1966 | Koblitz et al. ........... 525/199 |
| 5,959,022 | A | * | 9/1999 | Lin et al. ................. 524/520 |
| 6,069,440 | A | * | 5/2000 | Shimizu et al. ......... 313/486 |
| 6,077,458 | A | * | 6/2000 | Shiiki et al. ........ 252/301.4 R |
| 6,773,804 | B2 | * | 8/2004 | Enlow et al. ............. 428/327 |
| 6,809,781 | B2 | * | 10/2004 | Setlur et al. ............. 349/70 |
| 6,870,311 | B2 | * | 3/2005 | Mueller et al. .......... 313/491 |
| 7,795,797 | B2 | * | 9/2010 | Kondo et al. ............ 313/503 |
| 8,125,139 | B2 | * | 2/2012 | Emoto et al. ............ 313/503 |
| 2001/0026851 | A1 | * | 10/2001 | Hilmarcher .............. 428/31 |
| 2002/0171046 | A1 | * | 11/2002 | Kawabata et al. ........ 250/484.4 |
| 2003/0080341 | A1 | | 5/2003 | Sakano et al. |
| 2003/0190485 | A1 | * | 10/2003 | Takatsuki et al. ........ 428/458 |
| 2003/0198738 | A1 | * | 10/2003 | Tian ...................... 427/212 |
| 2004/0155225 | A1 | * | 8/2004 | Yamada et al. ....... 252/301.4 R |
| 2004/0155255 | A1 | * | 8/2004 | Yamamoto et al. ....... 257/102 |
| 2005/0264194 | A1 | | 12/2005 | Ng et al. |
| 2006/0001352 | A1 | * | 1/2006 | Maruta et al. ............ 313/486 |
| 2006/0014035 | A1 | * | 1/2006 | Montanari et al. ........ 428/474.4 |
| 2006/0022146 | A1 | * | 2/2006 | Juestel et al. ........... 250/484.4 |
| 2006/0022573 | A1 | * | 2/2006 | Gotoh et al. ............. 313/467 |

FOREIGN PATENT DOCUMENTS

| CN | 1455960 A | 11/2003 |
| CN | 1607635 A | 4/2005 |
| JP | 57-141445 | 9/1982 |
| JP | 8-287714 | 11/1996 |
| JP | 11 500584 | 1/1999 |
| JP | 11-163417 A | 6/1999 |
| JP | 11 199781 | 7/1999 |
| JP | 2001-102639 A | 4/2001 |
| JP | 2002 363554 | 12/2002 |
| JP | 2003 124527 | 4/2003 |
| JP | 2003 206481 | 7/2003 |
| JP | 2003-318448 A | 11/2003 |
| JP | 2003-336044 | 11/2003 |
| JP | 2003 336059 | 11/2003 |
| JP | 2004-99607 | 4/2004 |
| JP | 2004 186278 | 7/2004 |
| JP | 2004 244560 | 9/2004 |
| JP | 2004-315822 | 11/2004 |
| JP | 2004 346233 | 12/2004 |
| JP | 2005 8793 | 1/2005 |
| JP | 2005-15651 | 1/2005 |
| JP | 2005-99474 | 4/2005 |
| JP | 2005 136379 | 5/2005 |
| JP | 2005 255895 | 9/2005 |
| JP | 2005281435 A | * 10/2005 |
| JP | 2006 45271 | 2/2006 |
| WO | 03 093393 | 11/2003 |
| WO | WO 2004042834 A1 | * 5/2004 |
| WO | WO 2004/055910 A1 | 7/2004 |
| WO | WO 2004/097294 A1 | 11/2004 |

OTHER PUBLICATIONS

English translation of abstract of JP 2005281435 to Miyata, Oct. 13, 2005.*

(Continued)

*Primary Examiner* — Sikha Roy
(74) *Attorney, Agent, or Firm* — Oblon, Spivak, McClelland, Maier & Neustadt, L.L.P.

(57) ABSTRACT

Provided is a phosphor for a white light emitting device with a blue to ultraviolet light as a light source.

A phosphor-containing resin composition comprising phosphor particles of at least one member selected from the group consisting of a nitride and an oxynitride, and a resin of at least one member selected from the group consisting of an epoxy resin, a silicone resin and a fluorine-containing resin.

19 Claims, No Drawings

OTHER PUBLICATIONS

Krebel, J. W. H Van, "On New Rare-Earth Doped M-Si-Al-O-N Materials", TU Eindhoven, pp. 145 to 161,1998.
Extended Abstracts (The 52$^{nd}$ Spring meeting, Saitama University), The Japan Society of Applied Physics and Related Societies, pp. 1614 to 1615, 2005.
Extended Abstacts (The 65$^{th}$ Autumn Meeting, Tohoku Gakuin University), The Japan Society of Applied Physics and Related Societies, pp. 1282 to 1284, 2004.
Japanese Office Action issued on Nov. 9, 2010 in corresponding Japanese Application No. 2005-173186 (with an English Translation).
Japanese Office Action issued Nov. 8, 2011, in Patent Application No. 2005-173186 (with English-language translation).
Office Action issued Jan. 6, 2012, in Chinese Patent Application No. 201010165140.6 with English translation.

* cited by examiner

PHOSPHOR-CONTAINING RESIN COMPOSITION AND SHEET, AND LIGHT EMITTING DEVICES EMPLOYING THEM

TECHNICAL FIELD

The present invention relates to a phosphor-containing resin composition useful for a power source containing a short wavelength light emitting device such as a blue light emitting diode (blue LED), a ultraviolet light emitting diode (ultraviolet LED) or a blue light or ultraviolet light emitting laser diode (LD), a sheet employing such a composition, and a light emitting device.

Further, the present invention relates to a LED having high light emitting intensity, excellent heat resistance and long operating life, a phosphor-containing resin composition to be used for such LED, and a LED sheet made of such a composition.

BACKGROUND ART

In recent years, a white LED has been widely used, and particularly, a white LED having a blue LED and a yellow phosphor combined is used for a light source for a liquid crystal display of a cell-phone or for an auxiliary light for a camera. A typical white LED has a structure wherein a blue LED is sealed by a mixture of a phosphor powder and a resin (Patent Document 1).

With such white LED, a part of blue light emitted from the blue LED will impinge on and be absorbed by the phosphor which will emit a yellow fluorescence, whereupon white light will be emitted by color mixing of blue and yellow colors which are in a complementary chromaticity relationship. However, this white light does not substantially contain a red color component and lacks also in a green color, and thus it is poor in color reproducibility and has a drawback such that even when it is applied as illuminating light to a red-colored object, it can not be observed as a fine red color. Therefore, such white light is sometimes called pseudo white.

On the other hand, it has been applied to prepare a white LED having color reproducibility improved by mixing three or four colors, for example, by combining a blue LED with a green phosphor and a red phosphor, or by combining an ultraviolet LED with phosphors having light's three primary colors of blue, green and red or further mixing a yellow phosphor thereto. However, there have been various problems, and those industrially produced are mostly pseudo white LED by a combination of a blue LED and a yellow phosphor.

If it is possible to use for illumination a white LED having color reproducibility improved, it is possible not to use mercury which is unavoidably used in a fluorescent lamp, and a long operating life and energy saving can be attained, such being good for the environment. However, at the present stage, the luminous efficiency is far below the level of a fluorescent lamp, and such can not be regarded as contributing to energy saving. Further, if LEDs with current output are to be arranged, many LEDs will be required such being disadvantageous also from the viewpoint of costs as compared with a fluorescent lamp. It is therefore an industrially important object to solve these problems.

In order to improve the luminous efficiency, it is most important to increase the luminous efficiency of blue and ultraviolet LEDs. Further, there are other problems to be solved such that a phosphor having sufficiently high efficiency for this application has not yet been available, the sealing resin is deteriorated by ultraviolet rays whereby the operating life of the light source tends to be shortened, and the light quantity per LED chip is small.

Further, as a phosphor, one employing an oxide, silicate, phosphate, aluminate or sulfide, as the matrix material and employing a transition metal or rare earth element, as the luminescent center, is widely known.

Further, with respect to a white LED, attention has been drawn to phosphors which are excited by an excitation source such as ultraviolet or blue light to emit visible light, and development thereof is under way. However, the above-mentioned conventional phosphors have a problem such that the luminance thereof decreases as a result of being exposed to the excitation source or a high temperature high humidity environment.

Therefore, as phosphors which are less susceptible to deterioration of the luminance, attention has recently been drawn to nitride and oxynitride phosphors, as they are materials having a stable crystal structure and being capable of shifting the excitation light and emission light to the longer wavelength side.

Among the nitride and oxynitride phosphors, an α-sialon activated by a specific rare earth element is known to have useful fluorescence properties, and its application to a white LED or the like is being studied (Patent Documents 2 to 6, and Non-Patent Document 1).

The α-sialon is a solid solution of α-silicon nitride and has a structure wherein specific elements (Ca and Li, Mg, Y or a lanthanide metal except for La and Ce) penetrate into a crystal lattice to form a solid solution, and Si—N bonds are partially substituted by Al—N bonds and Al—O bonds in order to maintain electrical neutrality. When a part of elements penetrating to form a solid solution is a rare earth element which becomes the luminescent center, the fluorescence property is exhibited.

Usually, the α-sialon is obtained by firing a powder mixture comprising silicon-nitride, aluminum-nitride, if necessary aluminum oxide, and oxides of elements penetrating to form a solid solution, at a high temperature in nitrogen. A variety of fluorescence properties can be obtained depending on the ratio of silicon nitride and the aluminum compounds, the types of elements penetrating to form a solid solution, the proportion of the element becoming the fluorescent center, etc.

It has been found that $CaSiAlN_3$, $Ca_2(Si,Al)_5N_8$ and a β-sialon activated by a rare earth element also have the similar fluorescence properties (Patent Documents 7 and 8, and Non-Patent Documents 2 and 3).

Other phosphors proposed include phosphors of nitrides and oxynitrides (hereinafter referred to also as nitride phosphors and oxynitride phosphors, respectively) such as aluminum nitride, magnesium silicon nitride, calcium silicon nitride, barium silicon nitride, gallium nitride and zinc silicon nitride.

Further, as sealing resins, epoxy resins have heretofore been used in many cases (Patent Document 1). However, epoxy resins have a drawback that when exposed to ultraviolet rays for a long time, the resins undergo coloration, whereby the light transmittance decreases, and the operating life of the light source will be shortened. To overcome such a drawback, recently, a silicone resin has been used as a sealing resin (Patent Document 9).

However, it is known that a silicone resin is also likely to be deteriorated when exposed to a large amount of ultraviolet rays. Especially, recently, development of high power LED is being pursued, and the power consumption or the light energy density per one chip tends to increase, and accordingly, deterioration of the resin by heat or ultraviolet rays tends to be remarkable.

The white LEDs obtained heretofore are inferior in luminous efficiency to fluorescent lamps, and there is a strong demand for a LED superior in luminous efficiency to the fluorescent lamps. A white LED employing a nitride phosphor or an oxynitride phosphor such as a sialon phosphor has an efficiency higher than an incandescent lamp, but in order to expand its application to general illumination, it is required to enlarge the emission element to increase the output and to attain high luminous efficiency and improvement of the characteristics for illumination.

On the other hand, in the case of an oxynitride phosphor or a nitride phosphor, the excitation spectrum of the phosphor is spread towards the bottom to the vicinity of about 250 nm on the shortest wavelength side, and in order to maximize the absorption of the excitation light, it is desired to employ a resin having high transparency up to the vicinity of 250 nm, but many resins have low light transmittance on the short wavelength side.

White light requires a combination of plural colors as is different from monochromatic light, and a general white LED is composed of a combination of an ultraviolet LED or a blue LED with a phosphor which emits visible light with the LED as an excitation source. Accordingly, in addition to the improvement in efficiency of the white LED, it is necessary to improve the efficiency of the phosphor to be used and further to improve the efficiency in taking out the emitted light to the outside. In order to expand the application of the white LED to general illumination, it is necessary to improve all of such efficiencies.

In many cases, such a phosphor is used as filled in the form of a powder in a resin. At the time of filling the phosphor powder in the resin, especially when the filling rate of the powder is low, sedimentation of the phosphor powder is likely to occur, and consequently, a density distribution is likely to result, thus leading to a problem such that the luminescence properties are unstable. It is widely known to employ a sedimentation-preventing agent of an organic type to prevent such a problem. However, a conventional sedimentation-preventing agent of an organic type is not transparent to the excitation light or emitted light, and thus, when the phosphor powder is filled in a resin at a low rate, there will be a problem such that the luminance tends to deteriorate.

Patent Document 1: JP-A-11-500584
Patent Document 2: JP-A-2002-363554
Patent Document 3: JP-A-2003-336059
Patent Document 4: JP-A-2003-124527
Patent Document 5: JP-A-2003-206481
Patent Document 6: JP-A-2004-186278
Patent Document 7: JP-A-2004-244560
Patent Document 8: JP-A-2005-255895
Patent Document 9: JP-A-2005-136379

Non-Patent Document 1: J. W. H. van Krebel, "On new rare-earth doped M-Si—Al—O—N materials", T U Eindhoven, The Netherlands, P. 145-161 (1998)

Non-Patent Document 2: Extended Abstracts (The 52nd Spring meeting, March, 2005, Saitama University) p. 1614-1615; The Japan Society of Applied Physics and Related Societies Non-Patent Document 3: Extended Abstracts (The 65th Autumn Meeting, September, 2004, Tohoku Gakuin University) p. 1282-1284; The Japan Society of Applied Physics

DISCLOSURE OF THE INVENTION

Problems to be Solved by the Invention

In view of the above described prior art, the present inventors have conducted a study with an object to provide a light source having a long operating life excellent in luminous efficiency, particularly a white light source, and as a result, have found it possible to accomplish such an object by using an oxynitride phosphor or a nitride phosphor, and a fluorine-containing resin in combination. The present invention has been made based on such a discovery.

As mentioned above, a white light source employing a blue or violet light emitting device or an ultraviolet light emitting device has had a problem that the resin used will be exposed to the blue to ultraviolet light emitted from the light emitting device, whereby the resin will be deteriorated, and a light source having sufficient durability tends to be hardly obtainable. Especially, a study has been recently advanced with respect to a large power light emitting device to take out a larger quantity of light by increasing an amount of injection current per one device, which means that it is exposed to a stronger light per unit area. Further, the heat generation per one device will increase, and the device temperature increases accordingly, whereby deterioration will proceed by both heat and light.

Further, due to an increase in the power consumption along with the large output, a further improvement of the luminous efficiency is desired, and some measures are desired also with respect to the structure and constituting materials of a light emitting device. For example, when light is transmitted through an interface of two media, the larger the difference in the refractive indices is, the larger the reflectance becomes, and the smaller the light transmittance becomes. Accordingly, the design of the refractive indices of materials constituting the pathway of light of a light emitting device influences the efficiency for taking light out of the light emitting device and thus presents an influence over the luminous efficiency.

Further, some light emitting devices contain a phosphor which is excited by blue or ultraviolet light to emit visible light. For this purpose, the resin to be used is required to transmit not only visible light but also light with shorter wavelengths. Even with a resin having a high transmittance of visible light, the light transmittance on the short wavelength side is not necessarily high, and a study in this respect is also required.

In addition, in many cases, a resin is usually used as a sealing resin as mixed with a phosphor, and the sealing resin is required to transmit light, and impurities such as air bubbles which scatter light, must be removed as far as possible. Especially, inclusion of air bubbles must be minimized. For this purpose, it is necessary to improve the affinity at the interface of the phosphor and the resin, and it is also required that the dispersed state of the phosphor in the resin is maintained to be in a proper state.

It is an object of the present invention to solve the above mentioned problems of the prior art and to provide a light emitting device excellent in luminous efficiency, for example, a white LED, particularly a white LED employing a blue LED or ultraviolet LED as a light source, and to provide a phosphor-containing resin composition, more specifically a sealing resin or sheet, useful for such a device, constantly on an industrial scale.

Further, it is an object of the present invention to prevent sedimentation of a phosphor powder when the phosphor powder is filled in a resin to obtain a phosphor-containing resin composition having the phosphor powder uniformly dispersed in the resin, thereby to stabilize the luminescence properties of the phosphor and further to provide a LED or LED component which is excellent in the luminescence properties and which is excellent also in heat resistance and has a long operating life.

Means to Solve the Problems

The present inventors have conducted various experimental studies on a resin-sealed white light source employing a nitride phosphor or an oxynitride phosphor and have found that the properties such as the luminous efficiency, operating life, etc. of the white light source substantially depend on a proper combination of various factors including, for example, the luminescence properties of the phosphor, the composition, light transmittance and ultraviolet deterioration resistance of the resin and the dispersed state of the phosphor in the resin. The present invention has been accomplished on the basis of the discovery.

Namely, the present invention provides the following.
(1) A phosphor-containing resin composition comprising phosphor particles of at least one member selected from the group consisting of a nitride and an oxynitride, and a resin of at least one member selected from the group consisting of an epoxy resin, a silicone resin and a fluorine-containing resin.
(2) The phosphor-containing resin composition according to (1), wherein the fluorine-containing resin is an alloy containing at least one resin selected from the group consisting of ETFE, PTFE, FEP, PFA, PVDF, PVF and PCTFE.
(3) A phosphor-containing resin composition comprising phosphor particles, particles having optical transparency in a wavelength region of from 300 to 800 nm, and a resin.
(4) The phosphor-containing resin composition according to (3), wherein the particles having optical transparency have a specific surface area of from 30 m$^2$/g to 400 m$^2$/g.
(5) The phosphor-containing resin composition according to (3) or (4), wherein the particles having optical transparency are made of at least one member selected from the group consisting of silicon oxide, aluminum oxide, titanium oxide, cerium oxide, yttrium oxide, zinc oxide, tin oxide and ITO.
(6) A sealing material employing the phosphor-containing resin composition as defined in (1) or (2).
(7) A phosphor sheet employing the phosphor-containing resin composition as defined in (1) or (2).
(8) A phosphor composite sheet containing the phosphor sheet as defined in (7) as a part of its constituting components.
(9) A light emitting device comprising the phosphor-containing resin composition as defined in (1) or (2), and a blue to ultraviolet light emitting element.
(10) A light emitting device comprising the sealing material as defined in (6), and a blue to ultraviolet light emitting element.
(11) A light emitting device comprising the phosphor sheet as defined in (7), and a blue to ultraviolet light emitting element.
(12) A light emitting device comprising the phosphor composite sheet as defined in (8), and a blue to ultraviolet light emitting element.
(13) A LED employing the phosphor-containing resin composition as defined in any one of (1) and (3) to (5).
(14) A sheet for LED employing the phosphor-containing resin composition as defined in any one of (1) and (3) to (5).

Effects of the Invention

The phosphor-containing resin composition of the present invention has a characteristic such that the change by temperature of the emission intensity of the oxynitride phosphor or the nitride phosphor is little and the operating life is long, and it contains a fluorine-containing resin having a high transmittance of the excitation light for the phosphor, whereby it is excellent in the luminous efficiency and suitable for providing e.g. a white LED, particularly a white LED with a blue LED or an ultraviolet LED as a light source.

Further, the sealing material, phosphor sheet or phosphor composite sheet of the present invention, and a light emitting device comprising it and a blue or ultraviolet light emitting element, are excellent in luminescence properties and have a long operating life, reflecting the above mentioned characteristics of the phosphor-containing resin composition.

Further, the phosphor-containing resin composition of the present invention contains phosphor particles and particles having optical transparency in a specific wavelength region, in a resin, and even when the phosphor powder is incorporated in a small amount, it is possible to obtain a phosphor-containing resin composition having the phosphor powder uniformly dispersed in the resin. As a result, it is possible to reduce fluctuation in the excitation light for the phosphor and luminance during emission, whereby the luminescence properties are stable over a long period, and the composition is suitable as a phosphor for various illumination devices including LEDs.

Further, the sheet for LED of the present invention employs the above-mentioned phosphor-containing resin composition excellent in the luminescence properties and thus is capable of performing a function to change the wavelength of LED or to protect the LED surface from scratches or stains, for example, by using it in front of the LED.

BEST MODE FOR CARRYING OUT THE INVENTION

The phosphor to be used in the present invention is at least one member selected from the group consisting of a nitride phosphor and an oxynitride phosphor.

Among phosphors which are excited by blue, purple or ultraviolet light to emit visible light, nitride or oxynitride phosphors have excellent properties with respect to luminous efficiency, operating life and temperature properties, as compared with other phosphors. For example, many phosphors have been proposed in a few years, including one having α-sialon or β-sialon as a matrix crystal and having Eu or Yb doped as a rare earth element, CaSiAlN$_3$ and Ca$_2$(Si, Al)$_5$N$_8$. Such nitride or oxynitride phosphors are characterized in that as compared with oxide phosphors or sulfide phosphors, the change by temperature of the emission intensity is small, and the stability of crystal is high, so that the operating life is long.

Among nitride phosphors and oxynitride phosphors, α-sialon phosphors are ones represented by the following formula.

Namely, phosphors made of α-sialon compounds (hereinafter sometimes referred to simply as α-sialon) represented by the general formula: $(M1)_X(M2)_Y(Si)_{12-(m+n)}(Al)_{m+n}(O)_n(N)_{16-n}$, where M1 is at least one element selected from the group consisting of Li, Mg, Ca, Y and lanthanide metals (except for La and Ce), and M2 is at least one element selected from the group consisting of Ce, Pr, Eu, Tb, Yb and Er, $0.3 \leq X+Y \leq 1.5$, $0<Y \leq 0.7$, $0.6 \leq m \leq 3.0$, $0 \leq n \leq 2.5$, and X+Y=m/(average valence of M1 and is M2).

Preferred is a phosphor wherein the amount of oxygen contained in the α-sialon powder is larger by at most 0.4 mass % than the value calculated based on the above general formula, M1 is Ca, and M2 is Eu.

For an α-sialon phosphor, it is preferred to employ, as a raw material, a calcium compound containing no oxygen for at least a part of the raw material for calcium. Further, it is preferred that after producing the phosphor, such a phosphor is further subjected to acid treatment, whereby the emission intensity may further be improved.

With respect to the above α-sialon phosphors, the present inventors measured their fluorescence properties by using a fluorescence spectrophotometer (manufactured by Hitachi, Ltd.), whereby the excitation spectra were found to have peaks in the vicinity of 300 nm and 400 nm, and the peak wavelengths of the emission spectra measured at an excitation wavelength of 400 nm were from 565 to 610 nm.

Further, with respect to a nitride phosphor or an oxynitride phosphor, it is preferred to bond on its surface a coating film made of a material which has a refractive index inbetween the phosphor and the resin, whereby the luminous efficiency will increase with each of the nitride phosphor and the oxynitride phosphor. In such a case, it is preferred to employ a phosphor wherein on at least a part of the surface of the phosphor particles, a surface coating is formed in a thickness of (10 to 180)/n (unit: nanometer) (where n is the refractive index of the transparent film, which is from 1.2 to 2.5, preferably, the refractive index of the transparent film being from 1.5 to 2.0). Further preferably, the thickness is (30 to 150)/n (unit: nanometer), and the refractive index of the transparent film is from 1.6 to 1.9.

The blend proportion of the phosphor powder in the phosphor-containing resin composition can not generally be defined, since it depends on the type of the light source, the environmental condition of how the phosphor powder is exposed to the light source, the desired color, etc. However, in a case where a powder of phosphor made of the above mentioned oxynitride is employed, its blend proportion is usually from 0.5 to 30 vol %, more preferably from 1 to 10 vol %.

Such a nitride phosphor or an oxynitride phosphor can exhibits its properties sufficiently for the first time when it is used together with a resin which is strong against ultraviolet rays and which has a long operating life.

As the resin to be used in the present invention, one which is transparent and of which the optical properties undergo no change over a long period of time even if it is exposed to ultraviolet rays or visible light, may be employed. According to the study by the present inventors, an epoxy resin, a silicone resin or a fluorine-containing resin is preferably selected. It is of course possible to use two or more of them as mixed.

With respect to the above resin, normal temperature curing or heat curing is known as its curing method. However, at the time of curing the resin composition of the present invention, heat curing is a preferred method to prevent the phosphor powder from becoming non-uniform.

In the present invention, a particularly preferably employed resin is a fluorine-containing resin, and it may, for example, be ETFE, PTFE, FEP, PFA, PVDF, PVF and PCTFE.

As mentioned above, in order to increase the luminous efficiency of a nitride phosphor or an oxynitride phosphor, the resin to be used in the present invention preferably has a high visible light transmittance and preferably also has a high transmittance of excitation light for the phosphor to be used. As a resin having such properties, only a fluorine-containing resin is selected. However, a fluorine-containing resin represented by a fluororesin has a small surface energy and usually can hardly be mixed with other materials. However, according to a study by the present inventor, it has been found that with a nitride phosphor or an oxynitride phosphor, the heat-melted resin or the resin dissolved in a solvent can easily be mixed by a kneader such as a three roll mill or by a stirring vessel equipped with stirring vanes. Further, by treatment with a silane coupling agent or surface coating with silica or alumina, of the phosphor powder, it is possible to obtain an effect such that the mixing time or a vacuum-defoaming time can be shortened.

The phosphor-containing resin composition of the present invention has made it possible to mix a fluorine-containing resin which used to be generally considered to be hardly mixed with other materials, with a phosphor having a specific composition being a nitride phosphor or an oxynitride phosphor. It thereby has a characteristic such that with a light source in its combination with a blue, purple or ultraviolet light emitting element, it is possible to provide properties such as long operating life and high luminous efficiency. Especially with a light source in its combination with a purple or ultraviolet light emitting element, the difference from a case where a conventional epoxy resin or a silicone resin is employed, is remarkable.

The excitation spectrum of the nitride phosphor or the oxynitride phosphor has two peaks at wavelengths in the vicinity of 400 nm and 300 nm in the case of e.g. an α-sialon phosphor. On the short wavelength side, absorption becomes small at about 250 nm, and also with other phosphors, the absorption likewise becomes small in the vicinity of 250 nm. Therefore, with respect to the above mentioned fluorine-containing resin, when the thickness of the resin is 50 μm, the transmittance of light of 250 nm is preferably at least 60%, particularly preferably at least 65%.

The light transmittance of the resin depends on e.g. the crystallinity, the symmetrical property of the polymer structure or the regularity of the steric structure influential over the crystallinity, use of a nucleating agent, addition of a compatibilizing agent, the density distribution, the refractive index and the refractive index distribution.

Among fluorine-containing resins, a fluororesin, particularly PTFE, is a crystalline polymer and has low transparency. However, the transparency can be increased by properly adjusting the form of the monomer, copolymerization, processing method, etc. For example, compared to PTFE as a typical fluororesin homopolymer, the processability of FEP, ETFE or PFA made by copolymerizing is improved, and at the same time, the light transmittance can also be improved. Further, a perfluorodioxole polymer (tradename: Teflon RF, manufactured by Du Pont) or a perfluorobutenyl vinyl ether polymer (tradename: CYTOP, manufactured by Asahi Glass Company, Limited) has a cyclic structure in its main chain, whereby it is likely to be non-crystalline and has high transparency.

Each of FEP, ETFE, PFA, Teflon FR (registered trademark) and CYTOP (registered trademark) was formed into a film having a thickness of 50 μm, and a light transmission spectrum was measured by an ultraviolet visible light spectrophotometer, whereby a transmittance of from about 60 to 90% at 250 nm was obtained. The transparency of the film can be improved by increasing the cooling rate and minimizing the surface roughness of the roll surface at the time of preparing the film.

Further, the fluorine-containing resin is preferably an alloy containing at least one resin selected from the group consisting of ETFE, PTFE, FEP, PFA, PVDF, PVF and PCTFE. By alloying, the resin can readily be made non-crystalline, and it is possible to improve the transparency. Especially, an alloy of PVDF and PMMA is constituted by relatively inexpensive materials and is excellent in transparency and processability, and thus is suitable for the purpose of the present invention. An alloy comprising 80 parts by mass of PVDF and 20 parts by mass of PMMA is particularly excellent in transparency, and the light transmittance at a wavelength of 250 nm measured in the same manner as described above, of its film (tradename: DX film, manufactured by Denki Kagaku Kogyo Kabushiki Kaisha) is at least 80 to 90%, such being particularly suitable for the purpose of the present invention.

Such a fluorine-containing resin has the highest weather resistance among resins and is known as a resin with minimum deterioration in such an environment as exposed to sunlight outdoors. Thus, it is a resin most excellent in durability as a resin to be used for a white light source having a blue or purple light source or an ultraviolet light source, whereby the operating life of the white light source can be extended substantially as compared with heretofore.

Further, the majority of fluorine-containing resins belong to a group having the smallest refractive index at a level of at most 1.4 among many resins, and they have a small difference from the refractive index of a gas and thus have a characteristic such that the efficiency to take light out in the gas is high. Further, they have merits such that the Abbe number is large, and the chromatic aberration is small.

Further, in the present invention, by using in combination with the above phosphor powder, particles having optical transparency in a wavelength region of the excitation light for the phosphor powder and the emitted light passing through a cured product of the phosphor-containing resin composition, it is possible to accomplish uniform dispersion of the phosphor powder in the resin even in a case where the phosphor powder is incorporated in a small amount. As a result, the optical properties of the phosphor-containing resin composition can be made extremely uniform and stable.

In the present invention, in a case where ultraviolet light or blue light is used as excitation light, and a phosphor powder emitting yellow to orange light from the above excitation light is used in combination to obtain white light, it is preferred to use particles having optical transparency in a wavelength region of from 300 to 800 nm, in combination with a resin and the phosphor powder. As the particles having optical transparency, ones having optical transparency in a wavelength region of from 350 to 700 nm are particularly preferred.

In the present invention, being optically transparent is preferably such that the transmittance of light having a wavelength in the above mentioned wavelength region is at least 80%, more preferably at least 90%.

With respect to the particles having optical transparency, their size is preferably a size where they can easily be mixed also with the resin. According to a study by the present inventors, the specific surface area value is preferably at least 30 $m^2/g$, more preferably at least 50 $m^2/g$. With respect to the upper limit value, there is no particular technical significance, but in view of availability, the size is usually at most 400 $m^2/g$.

As a method to disperse the phosphor powder and the particles having optical transparency in the resin, a stirring method utilizing rotation and revolution is preferred. A method of using stirring vanes should better be avoided, since impurities are likely to be included during the stirring, or air bubbles are likely to be incorporated in the resin.

The amount of the particles having optical transparency in the phosphor-containing resin composition may be suitably adjusted depending upon the type, specific surface area and specific gravity of the particles having optical transparency; the specific gravity, particle size, particle shape and filling rate of the phosphor particles; and the viscosity of the resin. However, it is usually selected to be from 0.03 to 10 vol %, particularly preferably from 0.2 to 5 vol %.

Specific examples of the particles having optical transparency in a wavelength region of from 350 to 600 nm include silicon oxide, aluminum oxide, titanium oxide, cerium oxide, yttrium oxide, zinc oxide, tin oxide and ITO (indium titanate).

In the present invention, these materials may be used alone or in combination as a mixture of two or more of them.

Among the above optically transparent particles, each of silicon oxide and aluminum oxide is preferred, since high purity, and spherical one is readily available, and the effects of the present invention can thereby be easily accomplished.

The phosphor-containing resin composition of the present invention is suitably employed as a sealing agent in the following applications. Namely, in the case of a surface mounting LED, the phosphor-containing resin composition of the present invention is diluted with a solvent to prepare a screen printing ink containing it as the main component, which is screen-printed, dried and heated in vacuum, whereby a LED element can be buried with the composition of the present invention. Further, in the case of a round lamptype LED, a LED element is fixed to a lead frame, followed by wire bonding, and then, the phosphor-containing resin composition of the present invention melted under heating, is put thereon by potting, followed by heat curing, whereby the LED element can be covered with the composition. In some cases, the LED element may be buried with other resin layer, and a layer of the phosphor-containing resin composition of the present invention may be formed thereon. In such a case, it is preferred to employ a resin having a high refractive index as the resin to bury the LED element, whereby the efficiency to take light out will be improved.

Further, it is preferred to process the phosphor-containing resin composition of the present invention into a sheet and use it as a phosphor sheet. In the case of the above mentioned method by potting or screen printing, a step of melting or softening the resin is included, whereby the phosphor tends to move in the resin, and its distribution tends to be non-uniform, and thus, there is a drawback that the color or the color distribution of the light source is likely to change.

When the sheet of the present invention is used, in the assembling step, there will be no change in the position of the phosphor, and further, if the phosphor is uniformly dispersed in the sheet, it is possible to prevent a change in color or nonuniformity in the distribution of the phosphor to cause localization of the emitted color.

Such a sheet having a phosphor powder dispersed can be prepared by a T-die melt extrusion method or by applying a mixture of a phosphor and a resin on the surface of a sheet preliminarily prepared. Further, such a phosphor sheet may be made of a plurality of layers, or the surface of such a phosphor sheet may be covered with another sheet to form a sheet made of a plurality of layers or a phosphor composite sheet. It is advisable to select a proper sheet depending upon the particular application.

The light emitting device of the present invention comprises a blue light emitting element or an ultraviolet light emitting element, a nitride phosphor or an oxynitride phosphor having properties to thereby emit light with e.g. 580 nm, and further a fluorine-containing resin having a high transmittance of excitation light for the nitride phosphor or the oxynitride phosphor, whereby it is excellent in luminescence properties and yet has a long operating life.

Further, the present invention provides a LED employing the above phosphor-containing resin composition, which has a structure such that a cured product of the above phosphor-containing resin composition is disposed in front of a light source such as a LED which emits an ultraviolet light or a blue light. By properly adjusting the thickness of the cured product, a white LED can be obtained. Further, the sheet for LED of the present invention is one obtainable by molding the above phosphor-containing resin composition into a sheet, followed by curing, and it can easily be obtained by bonding the cured sheet in front of the above mentioned light source such as a LED which emits an ultraviolet light or a blue light.

Further, a white LED can easily be obtained by preliminarily adjusting the amount of the phosphor to be incorporated or the thickness of the sheet. The obtained white LED has its surface covered with the cured product of the phosphor-containing resin composition, whereby it is possible to prevent problems such as formation of scratches by contact with other members, and the consequential deterioration in the emission properties.

EXAMPLES

Now, the present invention will be described in further detail with reference to Examples. However, it should be understood that the present invention is by no is means restricted to the following Examples.

Example 1-1

An α-sialon phosphor was prepared as follows. The blend composition of raw-material powders was 83.0 parts by mass of a silicon nitride powder (manufactured by Denki Kagaku Kogyo Kabushiki Kaisha, 9FW grade), 10.5 parts by mass of an aluminum nitride powder (manufactured by Tokuyama Corporation, F grade), 1.5 parts by mass of a europium oxide powder (manufactured by Shin-Etsu Chemical Co., Ltd., RU grade) and 5.5 parts by mass of a calcium sulfide powder (manufactured by Wako Pure Chemical Industries, Ltd.).

Then, the above raw-material powders were mixed by a wet ball mill with a silicon nitride pot and balls in an ethanol solvent for three hours, and filtered and dried to obtain a powder mixture. The amount of oxygen in the powder mixture was measured by an oxygen analyzer manufactured by LECO Corporation, and it was 1.2 mass %. 100 g of the powder mixture was filled in a boron nitride crucible with an inner diameter of 100 mm and a height of 60 mm, and subjected to a heat treatment in an electric furnace with a carbon heater in a nitrogen atmosphere at the atmospheric pressure and at 1,750° C. for 12 hours. The product thus obtained was crushed in an agate mortar and passed through a 45 μm-mesh sieve. A synthetic powder of an α-sialon phosphor was obtained by these operations.

The composition of the α-sialon powder, which was calculated based on analysis values of metal components of the obtained powder, was $Ca_{0.48}Eu_{0.05}Si_{10.4}Al_{1.6}O_{0.5}N_{15.5}$, wherein X+Y=0.53 and Y/(X+Y)=0.09. The amount of oxygen calculated based on the composition was 1.36 mass %. The amount of oxygen in the α-sialon phosphor obtained was measured by the oxygen analyzer manufactured by LECO Corporation, and it was 1.40 mass %. Furthermore, the fluorescence property was measured by means of a spectrophotofluorometer (manufactured by Hitachi, Ltd.), and the peak wavelength of a luminescence spectrum measured with an excitation wavelength of 400 nm was 580 nm.

30 g of the obtained α-sialon phosphor was added, together with 0.3 g of an epoxy type silane coupling agent (manufactured by Shin-Etsu Silicone K.K., KBE402), to 100 g of water, and the mixture was left to stand over night with stirring, and then filtered and dried to obtain an α-sialon phosphor treated with a silane coupling agent. One part of the obtained power of α-sialon phosphor treated with a silane coupling agent, and 100 parts by mass of CYTOP manufactured by Asahi Glass Company, Limited (CTX-809A, fluorine-type solvent solution of perfluorobutenyl vinyl ether polymer) were taken into a beaker and thoroughly mixed to obtain a composition comprising the phosphor and the resin.

The above composition was dropped on a LED mounted is on a surface-mounting package and having a wavelength of 450 nm as the emission peak wavelength, followed by heating in a vacuum dryer at 180° C. for one hour, whereby a white light emitting device comprising a LED which emits a blue light of 450 nm, an oxynitride phosphor which emits a yellow light upon absorption of the blue light, and the fluororesin. This device was placed in a constant temperature oven of 85° C., and an electric current of 20 mA was continuously conducted. The total light quantity was measured at the initial stage and one year later. When the total light quantity at the initial stage was regarded as 100, it was 95 one year later.

Comparative Example 1-1

0.5 Part by mass of the α-sialon phosphor treated with a silane coupling agent, prepared in Example 1-1 and 5.0 parts by mass of an epoxy resin (manufactured by SANYU REC CO., LTD., NLD-SL-2101) were kneaded. Then, it was put on a blue LED with an emission wavelength of 450 nm by potting, vacuum-deaerated and heat-cured at 110° C. to prepare a surface-mounting LED. This surface-mounting LED was put in a constant temperature oven of 85° C., and an electric current of 20 mA was continuously conducted. The total light quantity was measured at the initial stage and one year later. When the initial value in Example 1-1 was regarded as 100, the initial value in Comparative Example 1-1 was 96, and the total light quantity one year later was 62.

Example 1-2

The composition in Example 1-1 was put into a quartz container with a flat bottom and heated to evaporate the solvent to obtain a sheet having a thickness of 100 μm and having the phosphor dispersed. This sheet was put into an EYE Super UV Tester for a durability test and left to stand for 300 hours. In order to evaluate the fluorescence property of the sheet, excitation light of 300 nm was applied by means of a spectrophotofluorometer (manufactured by Hitachi, Ltd.) and the peak intensity of the fluorescence thereby emitted was compared, whereby when the peak intensity before the durability test was regarded as 100, it was 92 after the durability test.

Comparative Example 1-2

Parts by mass of the α-sialon phosphor powder prepared in Example 1-1, 100 parts by mass a hydrogenated bisphenol A type epoxy resin (YX8000, manufactured by Japan Epoxy Resins Co., Ltd.), 80 parts by mass of an acid anhydride (YH300, manufactured by Japan Epoxy Resins Co., Ltd.) and 1 part by mass of a curing accelerator were mixed by a rotary and revolutionary stirring machine, and the mixture was defoamed and then sandwiched and cured between glass plates to prepare a sheet having a thickness of 100 μm. With respect to this sheet, the durability test and the fluorescence measurement were carried out in the same manner as in Example 1-2. The initial value of the durability test was 51, and the value after the durability test was 22 (when the initial value in Example 1-2 was regarded as 100).

Example 1-3

The blend composition of raw material powders was 33.5 parts by mass of a silicon nitride powder (manufactured by Denki Kagaku Kogyo Kabushiki Kaisha, 9FW grade), 29.5 parts by mass of an aluminum nitride powder (manufactured by Tokuyama Corporation, F grade), 2.5 parts by mass of a europium oxide powder (manufactured by Shin-Etsu Chemical Co., Ltd., RU grade) and 35.0 parts by mass of calcium nitride (manufactured by Wako Pure Chemical Industries, Ltd.).

Then, the above raw-material powders were mixed by a wet ball mill with a silicon nitride pot and balls in a xylene solvent for three hours, and filtered and dried to obtain a powder mixture. 100 g of the powder mixture was filled in a boron nitride crucible with an inner diameter of 100 mm and a height of 60 mm, and subjected to a heat treatment in an electric furnace with a carbon heater in a nitrogen atmosphere under a pressure of 0.9 MPa at 1,800° C. for 12 hours. The product thus obtained was crushed in an agate mortar and passed through a 45 μm-mesh sieve, to obtain a $CaAlSiN_3$:Eu (Eu-doped $CaAlSiN_3$) phosphor powder.

With respect to the above phosphor powder, the peak wavelength of the luminescence spectrum measured with an excitation wavelength of 400 nm was 650 nm, and on such a basis that the luminescence intensity at the peak wavelength is regarded as 100, a comparison will be made relatively.

5.0 g of the obtained $CaAlSiN_3$:Eu (Eu-doped $CaAlSiN_3$) phosphor powder was thoroughly dispersed in 50 ml of isopropanol having 0.5 g of magnesium ethoxide (chemical formula: $Mg(OC_2H_5)_2$) dissolved. While the dispersion was thoroughly stirred, 50 ml of a 15% aqueous ammonia was dropwise added. The obtained slurry was filtered, washed, dried and fired at 1,100° C. for one hour in a nitrogen atmosphere to obtain a magnesia coating film-deposited phosphor.

The obtained phosphor was observed by a transmission electron microscope, whereby the thickness of the magnesia film was about 60 nm. The fluorescence spectrum was measured, whereby the luminescence spectrum intensity was 115.

10 Parts by mass of this phosphor powder, 72 parts by mass of commercially available PVDF (manufactured by ARKEMA, tradename: KYNAR PVDF, 1000HD) and 8 parts by mass of commercially available PMMA (manufactured by MITSUBISHI RAYON CO., LTD., tradename: ACRYPET, MF001) were heated, melted and mixed. Then, by means of a T-die extrusion machine, a sheet having a thickness of 200 μm was prepared.

With respect to this sheet, a durability test by means of an EYE Super UV Tester was carried out in the same manner as in Example 1-2. The luminescence intensity at the peak wavelength of the luminescence spectrum measured with an excitation wavelength of 400 nm was 95 after the durability test, when it was regarded as 100 before the durability test.

Example 1-4

90.1 Parts by mass of a silicon nitride powder (manufactured by Denki Kagaku Kogyo Kabushiki Kaisha, 9FW grade), 9.0 parts by mass of an aluminum nitride powder (manufactured by Tokuyama Corporation, F grade) and 0.9 part by mass of an europium oxide powder (manufactured by Shin-Etsu Chemical Co., Ltd., RU grade) were mixed in an ethanol solvent by means of a silicon nitride pot and balls for two hours, and filtered and dried to obtain a powder mixture. 100 g of the powder mixture was filled in a boron nitride crucible with an inner diameter of 100 mm and a height of 60 mm, and subjected to heat treatment in an electric furnace with a carbon heater in a nitrogen atmosphere of 0.9 MPa at 1,900° C. for 12 hours. The product thus obtained was crushed in an agate mortar and passed through a 45 μm-mesh sieve. A synthetic powder of a β-sialon phosphor was obtained by these operations. The fluorescence property was measured by means of a spectrophotofluorometer (manufactured by Hitachi, Ltd.), and the peak wavelength of a luminescence spectrum measured with an excitation wavelength of 400 nm was 540 nm.

10 g of the obtained phosphor was added, together with 0.1 g of an epoxy type silane coupling agent (manufactured by Shin-Etsu Silicone K.K., KBE402), to 50 g of water, and the mixture was left to stand over night with stirring. Then, filtration and drying were carried out to obtain an oxynitride phosphor treated with a silane coupling agent. 1 Part by mass of the obtained powder of the β-sialon phosphor treated with a silane coupling agent and 100 parts by mass of CYTOP manufactured by Asahi Glass Company, Limited (CTX-809A, fluorine type solvent solution of perfluorobutenyl vinyl ether polymer) were taken into a beaker and thoroughly mixed to obtain a composition comprising the phosphor and the resin. This composition was put into a quartz container having a flat bottom and heated to evaporate the solvent to obtain a sheet having a thickness of 100 μm and having the phosphor dispersed.

This sheet was put into an EYE Super UV Tester for a durability test and left to stand for 300 hours. The fluorescence property of the sheet was compared by the peak intensity of the fluorescence emitted by applying excitation light with 400 nm by means of a spectrophotofluorometer (manufactured by Hitachi, Ltd.), whereby the peak intensity was 94 after the durability test, when it was regarded as 100 before the durability test.

Comparative Example 1-3

20 Parts by mass of the β-sialon phosphor powder prepared in Example 1-4, 100 parts by mass of a hydrogenated bisphenol A type epoxy resin (XY8000, manufactured by Japan Epoxy Resins Co., Ltd.), 80 parts by mass of an acid anhydride (MeHHP) and 1 part by mass of a curing accelerator were mixed by a rotary and revolutionary stirring machine, and the mixture was defoamed and then sandwiched and cured between glass plates to prepare a sheet having a thickness of 200 μm. With respect to this sheet, the durability test and the fluorescence measurement were carried out in the same manner as in Example 1-4. The peak intensity was 92 before the durability test and 51 after the durability test.

Example 2-1

To 83.3 ml (100 g) of an epoxy resin EPIKOTE 828 (manufactured by Japan Epoxy Resins Co., Ltd.), 7.75 ml (24.8 g) of an α-sialon phosphor (manufactured by Denki Kagaku Kogyo Kabushiki Kaisha) having an average particle size of 15 μm (manufactured by COULTER, LS230) and 0.86 ml (1.9 g) of silicon oxide having a specific surface area of 80 $m^2/g$ (manufactured by Denki Kagaku Kogyo Kabushiki Kaisha, UFP-80) were incorporated, and 39.2 ml (38.0 g) of JEFFAMINE D-400 (manufactured by HUNTSMAN) as an epoxy resin curing agent and 25 ml (25.0 g) of JEFFAMINE D-2000 (manufactured by HUNTSMAN) were incorporated, followed by stirring by a super mixer AR-250 (manufactured by THINKY CORPORATION) to obtain a resin composition.

The resin composition was cast into a sample tubular bottle made of glass and heated at 80° C. for two hours and at 125° C. for three hours and cured. After the curing, from the upper end portion of the resin composition cast into the sample tubular bottle, the distance of the portion which became transparent as a result of sedimentation of the sialon phosphor, was measured. As a result, the sedimentation distance was 0 mm, i.e. no sedimentation took place.

Example 2-2

The resin composition in Example 2-1 was applied on a glass plate so that the thickness after the curing would be 50 μm, and heated at 80° C. for two hours and at 125° C. for three hours and cured to obtain a sheet.

This sheet was bonded to the emission surface of a blue LED, whereby white light was obtained.

Example 2-3

The resin composition in Example 2-1 was applied to the emission surface of a blue LED so that the thickness after curing would be 50 μm, and heated at 80° C. for two hours and at 125° C. for three hours to obtain a LED. This LED was operated, whereby white light was emitted.

Comparative Example 2-1

To 83.3 ml (100 g) of an epoxy resin EPIKOTE 828 (manufactured by Japan Epoxy Resins Co., Ltd.), 8.59 ml is (27.5 g) of an α-sialon phosphor (manufactured by Denki Kagaku Kogyo Kabushiki Kaisha) having an average particle size of 15 μm (manufactured by COULTER, LS230) was incorporated, and 39.2 ml (38.0 g) of JEFFAMINE D-400 (manufactured by HUNTSMAN) and 25 ml (25.0 g) of JEFFAMINE D-2000 (manufactured by HUNTSMAN) were incorporated as epoxy resin-curing agents. Then, the mixture was stirred by a super mixer AR-250 (manufactured by THINKY CORPORATION), then cast into a sample tubular bottle made of glass, heated at 80° C. for two hours and at 125° C. for three hours and cured. In the same manner as in Example 2-1, from the upper end portion of the resin composition cast into the sample tubular bottle, the distance of the portion which became transparent as a result of sedimentation of the sialon phosphor, was measured. As a result, the sedimentation distance was 5 mm, i.e. sedimentation took place.

Industrial Applicability

The phosphor-containing resin composition of the present invention has high luminous efficiency and is excellent in durability remarkably more than conventional products, and accordingly, a light emitting device having high luminous efficiency, particularly a white light emitting device having a phosphor and a blue to ultraviolet light emitting element combined, can be realized.

Especially, the long operating life and luminous efficiency of a white emitting LED employing an ultraviolet light emitting LED as a light source, are improved, and, as a mercury free illumination, such may be utilized as illumination of next generation which will be substituted for fluorescent lamps which are currently most commonly used, and is very useful from the industrial viewpoint and from the viewpoint of conservation of the global environment.

Further, the sealing material, phosphor sheet and phosphor composite sheet as practical embodiments of the composition of the present invention, can suitably be used in the respective applications when the above-mentioned phosphor-containing resin composition is practically used, and they can exhibit an effect to increase the operation efficiency in assembling of light emitting devices.

Further, the light emitting device of the present invention comprises the above-mentioned phosphor-containing resin composition and a blue to ultraviolet light emitting element and thus, as a mercury free illumination, may be utilized as illumination of next generation to be substituted for fluorescent lamps which are currently most commonly used, and it is very useful from the industrial viewpoint and from the viewpoint of conservation of the global environment.

On the other hand, the phosphor-containing resin composition of the present invention is characterized in that even when the phosphor powder is incorporated in a small amount in the resin, it is uniformly dispersed, whereby a cured product of the resin composition has a luminance property which is stable over a long period and thus is suitable as a phosphor for various illumination devices including LEDs.

Further, the sheet for LED of the present invention employs the above mentioned phosphor-containing resin composition excellent in the luminescence property and thus is capable of achieving functions to change the wavelength of LEDs or to protect LEDs from e.g. scratches or stains to be formed on the LED surface, for example, when used in front of LEDs.

The entire disclosures of Japanese Patent Application No. 2005-173186 filed on Jun. 14, 2005 and Japanese Patent Application No. 2005-279855 filed on Sep. 27, 2005 including specifications, claims and summaries are incorporated herein by reference in their entireties.

The invention claimed is:

1. A phosphor resin composition comprising:
   phosphor particles, and
   a fluorine resin composition,
   wherein the phosphor particles comprise at least one of a-sialon matrix crystals and β-sialon matrix crystals, and are doped with at least one of Eu and Yb, wherein the surfaces of the phosphor particles comprise a coating film of a coating material having a refractive index between the refractive index of the phosphor particles and the refractive index of the fluororesin composition, and wherein the phosphor particles are treated with a silane coupling agent, and
   wherein the fluorine resin comprises PMMA and PVDF.

2. The phosphor resin composition of claim 1, further comprising:
   optically transparent particles having optical transparency in a wavelength region of from 300 to 800 nm.

3. The phosphor resin composition according to claim 2, wherein the optically transparent particles have a specific surface area of from 30 m$^2$/g to 400 m$^2$/g.

4. The phosphor resin composition according to claim 2, wherein the optically transparent particles comprise at least one member selected from the group consisting of silicon oxide, aluminum oxide, titanium oxide, cerium oxide, yttrium oxide, zinc oxide, tin oxide and ITO.

5. The phosphor resin composition according to claim 2, wherein the optically transparent particles are selected from the group consisting of silicon oxide particles and aluminum oxide particles.

6. The phosphor resin composition according to claim 1, wherein the coating film has a thickness of (10 to 180 nm)/n, wherein n is the refractive index of the coating material.

7. The phosphor resin composition according to claim 6, wherein n is from 1.2 to 2.5.

8. The phosphor resin composition according to claim 1, wherein all of the phosphor particles comprise at least one of the α-sialon matrix crystals and the β-sialon matrix crystals.

9. The phosphor resin composition according to claim 1, wherein the phosphor particles are treated with an epoxy silane coupling agent.

10. The phosphor resin composition according to claim 1, wherein the phosphor particles are further treated with a perfluoroalkenyl vinyl ether polymer.

11. The phosphor resin composition according to claim 1, wherein the PMMA and the PVDF are the only resins in the fluorine resin composition.

12. The phosphor resin composition according to claim 1, wherein the phosphor particles comprise α-sialon matrix crystals.

13. The phosphor resin composition according to claim 1, wherein the phosphor particles comprise β-sialon matrix crystals.

14. A sealing material comprising the phosphor resin composition according to claim 1.

15. A phosphor composite sheet comprising the phosphor sheet according to claim 14.

16. A phosphor sheet comprising the phosphor resin composition on according to claim 1.

17. A light emitting device comprising the phosphor resin composition according to claim 1 and a blue to ultraviolet light emitting element.

18. An LED comprising the phosphor resin composition according to claim 1.

19. The phosphor resin composition according to claim 1, wherein the coating film has a thickness of (30 to 150 nm)/n wherein n is from 1.6 to 1.9.

* * * * *